(12) United States Patent
Chen et al.

(10) Patent No.: US 6,855,606 B2
(45) Date of Patent: Feb. 15, 2005

(54) SEMICONDUCTOR NANO-ROD DEVICES

(75) Inventors: Hao-Yu Chen, Hsin-Chu (TW);
Yee-Chia Yeo, Singapore (SG);
Fu-Liang Yang, Hsin-Chu (TW);
Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 85 days.

(21) Appl. No.: 10/370,792

(22) Filed: Feb. 20, 2003

(65) Prior Publication Data

US 2004/0166642 A1 Aug. 26, 2004

(51) Int. Cl.[7] .................. H01L 29/76; H01L 29/784; H01L 27/12; H01L 21/336; H01L 21/4763

(52) U.S. Cl. .................. 438/283; 438/281; 438/187; 438/299; 438/589; 438/770; 257/E21.542; 257/E21.629

(58) Field of Search ................ 438/283, 281, 438/589, 770, 299, 187; 257/E21.542, E21.624

(56) References Cited

U.S. PATENT DOCUMENTS

| | | | |
|---|---|---|---|
| 5,998,852 A | * 12/1999 | Berry et al. ............. | 257/513 |
| 6,114,725 A | 9/2000 | Furukawa et al. | |
| 6,342,410 B1 | 1/2002 | Yu | |
| 6,391,782 B1 | 5/2002 | Yu | |
| 6,391,796 B1 | 5/2002 | Akiyama et al. | |
| 6,411,725 B1 | 6/2002 | Rhoads | |
| 6,413,802 B1 | 7/2002 | Hu et al. | |

FOREIGN PATENT DOCUMENTS

| | | | |
|---|---|---|---|
| FR | 002617642 A | * | 1/1989 |
| JP | 402015675 A | * | 1/1990 |

OTHER PUBLICATIONS

Colinge, et al., *Silicon–On–Insulator "Gate–All–Around Device"*, IEEE 1990, IEDM, vol. 90, pp. 595–598, IMEC, Kapeldreef 75, 3030 Leuvevn, Belgium.

Nitayama, et al., *Multi–Pillar Surrounding Gate Transistor (M–SGT)for Compact and High–Speed Circuits*, IEEE March 1991, Transactions on Electronic Devices, vol. 38, No. 3, pp. 579–583.

K. Yamagata and T. Yonehara, *Selective Growth of Si Crystals From The Agglomerated Si Seeds Over Amorphous Substrates*, Appl. Phys. Lett. 61 (21), Nov. 23, 1992, pp. 2557–2559 American Institute of Physics.

Nobuhiko Sato and Takao Yonehara, *Hydrogen Annealed Silicon–On–Insulator*, Appl. Phys. Lett. 65 (15) Oct. 10, 1994, pp. 1924–1926, American Institute of Physics.

Christopher P. Auth and James D. Plummer, *Scaling Theory for Cylindrical, Fully–Depleted, Surrounding–Gate MOSFET's*, IEEE Feb. 1997, Electron Device Letters, vol. 18, No. 2, pp. 74–76.

Effendi Leobandung, et al., *Wire–Channel and Wrap–Around–Gate Metal–Oxide–Semiconductor Field–Effect Transistors With a Significant Reduction of Short Channel Effects*, J. Vac. Sci. Technol. B 15(6) Nov./Dec. 1997, pp. 2791–2794, American Vacuum Society.

(List continued on next page.)

*Primary Examiner*—John F. Niebling
*Assistant Examiner*—Ron Pompey
(74) *Attorney, Agent, or Firm*—Slater & Matsil, L.L.P.

(57) ABSTRACT

In a method of manufacturing a semiconductor device, a semiconductor layer is patterned to form a source region, a channel region, and a drain region in the semiconductor layer. The channel region extends between the source region and the drain region. Corners of the channel region are rounded by annealing the channel region to form a nano-rod structure. Part of the nano-rod structure is then used as a gate channel. Preferably, a gate dielectric and a gate electrode both wrap around the nano-rod structure, with the gate dielectric being between the nano-rod structure and the gate electrode, to form a transistor device.

12 Claims, 4 Drawing Sheets

OTHER PUBLICATIONS

Figure 1A:
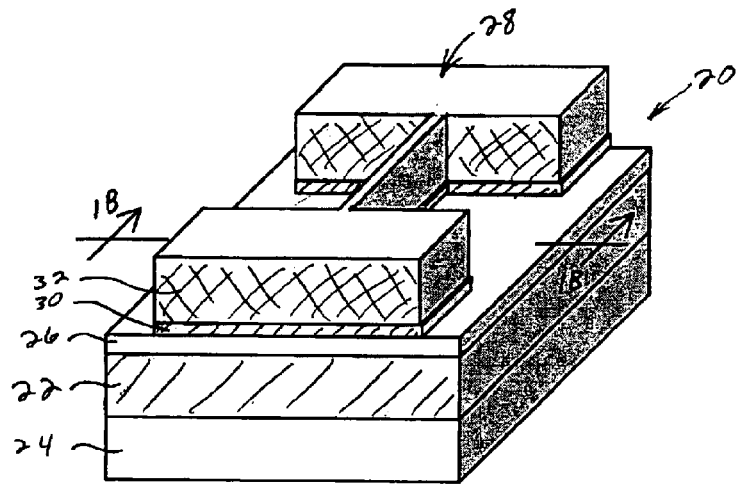

Minkyu Je, et al., *Quantized Conductance of a Gate-All-Around Silicon Quantum Wire Transistor*, Microprocesses and Nanotechnology Conference 1998, Department of Electrical Engineering, KAIST, Taejon, 305–701, Korea, pp. 150–151.

Farid Nemati and James D. Plummer, *A Novel Thyristor-Based SRAM Cell (T-RAM) for High-Speed, Low-Voltage, Giga-Scale Memories*, IEEE 1999, IEDM vol. 99, pp. 283–286, Center for Integrated Systesm, Stanford University, Stanford, CA.

Oh, et al., *Analytic Description of Short-Chanel Effects in Fully-Depleted Double-Gate and Cylindrical, Surrounding-Gate MOSFETs*, IEEE Sep. 2000, Electron Device Letters, vol. 21, No. 9, pp. 445–447.

Abhinav Kranti, et al., *Design Guidelines of Vertical Surrounding Gate (VSG)MOSFETs for Future ULSI Circuit Applications*, IEEE 2001, pp. 161–165.

\* cited by examiner

US 6,855,606 B2

SEMICONDUCTOR NANO-ROD DEVICES

TECHNICAL FIELD

The present invention relates generally to methods for manufacturing semiconductor devices. In one aspect, the present invention relates to a method of forming a nano-rod structure for a channel of a field effect transistor.

BACKGROUND

Metal-oxide-semiconductor field effect transistor (MOSFET) technology is currently the dominant semiconductor technology used for manufacturing ultra-large scale integrated (ULSI) circuits. As the gate length of the MOSFET is scaled down into the sub-30 nm regime for improved performance and density, the source and drain increasingly interact with the channel to sometimes gain influence on the channel potential. Hence, a transistor with a short gate length often suffers from problems related to the inability of the gate to substantially control the on/off states of the channel, which is often called short-channel effects.

Increased body doping concentration, reduced gate oxide thickness, and junction depths are some ways to suppress short-channel effects. However, for device scaling well into the sub-30 nm regime, the requirements for body-doping concentration, gate oxide thickness, and source/drain doping profiles become increasingly difficult to meet using conventional device structures based on bulk silicon substrates. Thus, alternative device structures that offer better control of short-channel effects are being considered to enable the continued scaling down of transistor sizes.

A highly scalable device structure that offers superior control of short-channel effects is a wrap-around gate structure for a transistor (a.k.a., surround-gate or gate-all-around transistor structure). A wrap-around gate structure typically has a gate that surrounds or wraps around a channel region. This structure effectively improves the capacitance coupling between the gate and the channel, as compared to conventional bulk silicon substrate transistor structures, double-gate transistor structures, and triple-gate transistor structures. With the wrap-around gate structure, the gate gains significant influence on the channel potential, and therefore improves suppression of short-channel effects. A wrap-around gate structure typically allows the gate length to be scaled down by about 50% more compared to a double-gate structure.

There are several different ways to implement a wrap-around gate transistor structure. For example, the transistor channel may be oriented vertically or horizontally. Many of the existing designs for horizontally oriented channels have a square or rectangular shaped cross-section. When the channel cross-section is rectangular or square, enhanced field effect at the corners of the rectangle may cause that part of the transistor to turn on earlier (i.e., having a lower threshold voltage) than parts of the transistor at the flat sides of the rectangular channel cross-section. This may result in a parasitic off-state leakage. Hence, a cylindrical channel cross-section is preferred over a rectangular channel cross-section.

Current attempts at obtaining a more circular channel cross-section are made by oxidizing the silicon beam forming the channel to round the corners of the rectangular channel cross-section. However, this method requires a large amount of oxidation, and hence a large amount of oxide formation, to convert the rectangular channel cross-section shape to a rounded or circular channel cross-section. Hence, there is a need for a way to manufacture a transistor channel having a rounded or circular cross-section shape without having to form excessive oxide about the channel.

SUMMARY

The problems and needs outlined above are addressed by embodiments of the present invention. In accordance with one aspect of the present invention, a method of manufacturing a semiconductor device is provided. This method includes the following steps. A semiconductor layer is patterned to form a source region, a channel region, and a drain region in the semiconductor layer. The channel region extends between the source region and the drain region. Corners of the channel region are rounded by annealing the channel region.

Next, some example annealing parameters that may be used are described. The annealing may occur in a reaction chamber having an environment therein including a gas of hydrogen, nitrogen, a mixed gas including hydrogen and argon, a mixed gas including hydrogen and nitrogen, or an inert gas. The annealing environment may be $H_2$ gas at a pressure ranging from about $1.0 \times 10^{-9}$ torr to about 800 torr. The annealing environment may be $N_2$ gas at a pressure ranging from about $1.0 \times 10^{-9}$ torr to about 800 torr. The annealing may occur in a reaction chamber having an evacuated environment. The annealing environment may be a vacuum environment at a pressure ranging from about $1.0 \times 10^{-10}$ torr to about $1.0 \times 10^{-3}$ torr. The annealing may occur in a reaction chamber having a temperature ranging from about 600° C. to about 1200° C. therein. The annealing occurs at an anneal time ranging from about 1 second to about 2 hours. The annealing may be performed in a hydrogen gas ($H_2$) environment at about 900° C. for about 2 minutes.

In accordance with another aspect of the present invention, a method of manufacturing a semiconductor device is provided. This method includes the following steps. A semiconductor layer is patterned to form a source region, a channel region, and a drain region in the semiconductor layer. The channel region extends between the source region and the drain region. Corners of the channel region are rounded by annealing the channel region. The insulating layer is etched using an etch chemistry selective against etching the semiconductor layer. The etching is performed long enough so that at least a segment of the rounded channel region is suspended above a proximate portion of the insulating layer. A gate dielectric material is formed on a surface of and about the rounded channel region. A gate electrode material is formed on the gate dielectric and about the rounded channel region. The gate electrode material is patterned to form a gate electrode. The gate electrode includes a gate wrap region that wraps around the rounded channel region and a gate contact region extending therefrom.

In accordance with yet another aspect of the present invention, a semiconductor device is provided, which includes an insulating layer, an underlying layer, a layer of semiconductor material, a gate dielectric, and a gate electrode. The insulating layer is over the underlying layer. The layer of semiconductor material is over the insulating layer. The semiconductor layer has a source region, a drain region, and an annealed nano-rod structure extending between the source and drain regions. The gate dielectric is formed on the surface of at least a segment of the nano-rod structure. The gate electrode is formed on the surface of the gate dielectric at the segment. Preferably, the gate dielectric and the gate electrode are both formed completely around the nano-rod structure at the segment. Preferably, the nano-rod structure has a cross-section diameter less than about 65 nm.

In accordance with still another aspect of the present invention, a semiconductor device including a plurality of transistors, is provided. Each of the plurality of transistors includes an annealed semiconductor layer, a gate dielectric surface layer, and a gate electrode. The annealed semiconductor layer has a source region, a drain region, and a channel region formed therein. The channel region extends between the source region and the drain region. The source region has a substantially flat source contact portion. The drain region has a substantially flat drain contact portion. The channel region has a substantially circular cross-section shape. The gate dielectric surface layer wraps around a segment of the channel region. The gate electrode has a gate wrap region that wraps around the segment of the channel region and a gate contact region extending therefrom. The gate dielectric layer is between the segment of the channel region and the gate wrap region of the gate electrode.

BRIEF DESCRIPTION

For a more complete understanding of the present invention, and the advantages thereof, reference is now made to the following descriptions taken in conjunction with the accompanying drawings, in which:

FIGS. 1A, 2A, 3A, 4A, 5A, and 6A show simplified perspective views of one transistor device being manufactured on a semiconductor device in accordance with a preferred embodiment of the present invention;

FIGS. 1B, 2B, 3B, 4B, 5B, and 6B are simplified cross-section views of FIGS. 1A, 2A, 3A, 4A, 5A, and 6A, respectively, as taken along lines 1B—1B, 2B—2B, 3B—3B, 4B—4B, 5B—5B, and 6B—6B, respectively; and FIGS. 7A–7D show some possible variations of the nano-rod structure formed after an annealing processing in accordance with the present invention.

DETAILED DESCRIPTION

The use of presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Example embodiments of the present invention will be described herein in a specific context of making semiconductor devices, such as transistors. In other embodiments not shown, embodiments of the present invention also may include nano-wires or quantum-wires formed in accordance with the present invention. The present invention may also be applied, however, to other situations.

A preferred manufacturing process in accordance with the present invention may be used to make a transistor device. Some of the manufacturing steps of this preferred embodiment being used to make a transistor embodiment are illustrated in FIGS. 1A–6B. While describing the structure formation steps shown in FIGS. 1A–6B, process parameters and steps for the preferred embodiment will described, as well as some of the possible alternatives or variations of the process parameters and steps. However, the process parameters shown and/or described herein are merely examples to illustrate and describe the present invention. With the benefit of this disclosure, one of ordinary skill in the art will likely realize other variations and embodiments of the present invention within the scope and spirit of the appended patent claims.

FIGS. 1A, 2A, 3A, 4A, 5A, and 6A show simplified perspective views of one transistor device 20 being manufactured on a semiconductor device. Such a semiconductor device will often have millions of these transistors 20. However, for purposes of illustration and discussion, only one transistor device 20 is shown and the remainder of the semiconductor device is not shown. FIGS. 1B, 2B, 3B, 4B, 5B, and 6B are simplified cross-section views of FIGS. 1A, 2A, 3A, 4A, 5A, and 6A, respectively, as taken along lines 1B—1B, 2B—2B, 3B—3B, 4B—4B, 5B—5B, and 6B—6B, respectively.

Figure 1B:
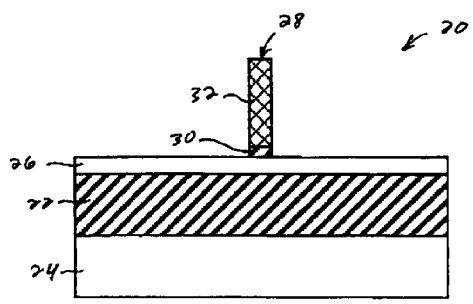

Referring to FIGS. 1A and 1B, an intermediate structure is shown having an insulating layer 22 formed on an underlying layer 24. A semiconductor layer 26 is formed on the insulating layer 22. This type of structure is sometimes referred to as a silicon-on-insulator substrate and is commonly available as a starting material. A patterned active region mask 28 is formed on the semiconductor layer 26. The mask 28 may be formed from a pad silicon oxide layer 30 and a silicon nitride layer 32, for example. With the mask 28 in place having a pattern desired to be formed in the semiconductor layer 26, the semiconductor layer 26 is preferably anisotropically etched (e.g., dry plasma etching) to conform the semiconductor layer 26 to the pattern of the mask 28.

The underlying layer 24 will often be a silicon wafer, for example. However, the underlying layer 24 may be another type of layer, including but not limited to: an elemental semiconductor, such as germanium; an alloy semiconductor, such as silicon-germanium; or a compound semiconductor, such as gallium arsenide or indium phosphide, for example.

The insulating layer 22 in some embodiments may be referred to as a "buried oxide" layer. However, the insulating layer 22 may be composed of a material or a combination of materials from a large variety of materials, including but not limited to: silicon dioxide, silicon nitride, aluminum oxide, plastic, or polymer, for example. In a currently preferred embodiment, the insulating layer 22 is composed of silicon dioxide ($SiO_2$).

The semiconductor layer 26 may be composed of a material or a combination of materials from a large variety of materials, including but not limited to: any semiconductor material, silicon, carbon, elemental semiconductor material (e.g., germanium), alloy semiconductor material (e.g., silicon-germanium, silicon-germanium-carbon), compound semiconductor material (e.g., indium phosphide, gallium arsenide), plastic, or polymer, for example. Such materials may be in crystalline or amorphous forms. In a currently preferred embodiment, the semiconductor layer 26 is composed of silicon. Hence, in the preferred embodiment shown in FIGS. 1A–6B, the semiconductor layer 26 is a silicon layer.

Figure 2A:
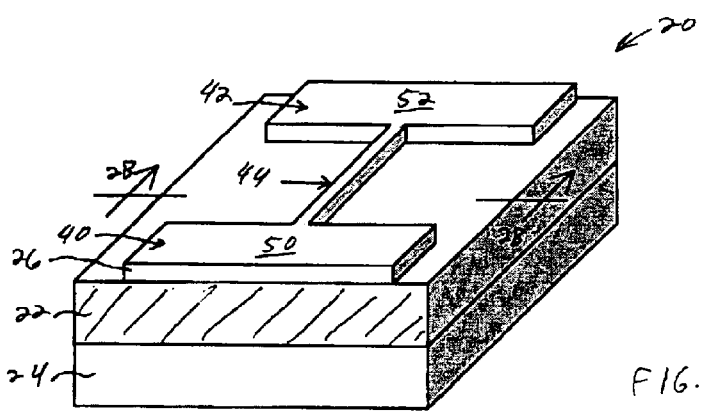
Figure 2B:
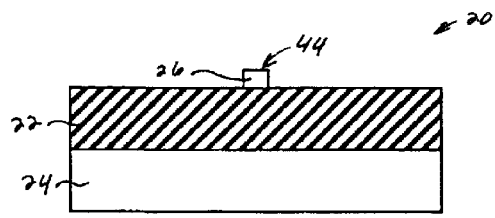

In FIGS. 2A and 2B the mask 28 has been removed and the patterned semiconductor layer 26 remains in the form of an H-shaped, thin silicon island. However, in other embodiments (not shown), the patterned semiconductor layer 26 may have other shapes (e.g., U-shaped, V-shaped, I-shaped, L-shaped, etc.). The thickness of the patterned silicon layer or island 26 may range from about two angstroms to about 1000 angstroms, for example. The patterned silicon layer 26 has a source region 40, a drain region 42, and a channel region 44. The channel region 44 extends between the source region 40 and the drain region 42. As shown in FIG.

2A, the channel region 44 has a width that is much narrower than the contact pad portions 50 and 52 of the source and drain regions 40 and 42, respectively.

Figure 3A:
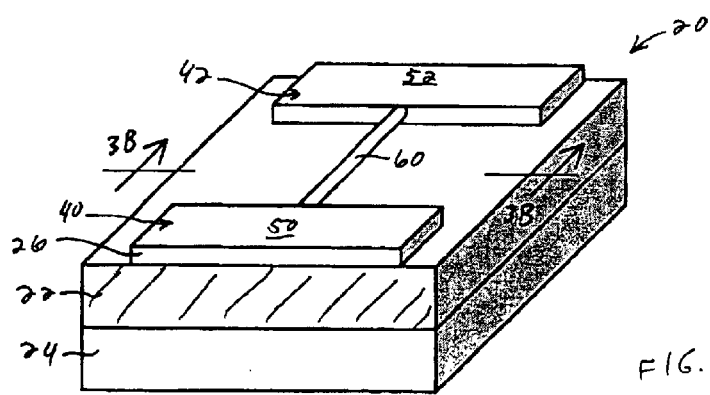
Figure 3B:
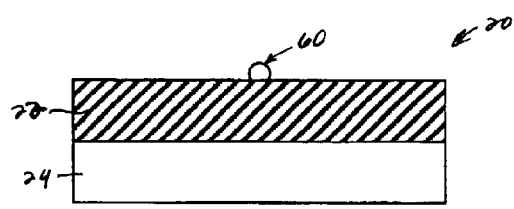

Next, the silicon atoms in the patterned silicon layer 26 are re-arranged by annealing the silicon layer 26 at elevated temperatures. The re-arrangement is induced by surface migration of silicon atoms driven by a tendency to minimize surface tension. During the annealing, the re-arrangement of the atoms at the narrow channel region 44 causes the corners of the channel region 44 to be rounded, as shown in FIGS. 3A and 3B, to transform the channel region 44 into a nano-rod structure 60. If carried out long enough and/or under sufficient heat, the resulting nano-rod structure 60 may be completely rounded having a circular-shaped cross-section, as shown in FIG. 3B. The contact pad portions 50 and 52 of the source and drain regions 40 and 42 will also likely experience slight shape changes, such as rounding of at least some of their corners. But because the contact pad portions 50 and 52 are much wider than the channel region, these contact pad portions 50 and 52 will typically still be substantially flat in shape or with only a slight curvature. The contact pad portions of the source and drain regions serve to provide a portion onto which metallic or conductive materials form electrical connection with the source and drain regions. It is understood that the contact pad is an optional feature of this invention. If the contact pad portions of the source and drain regions are omitted, the patterned semiconductor layer may be I-shaped, for example. In this case, the electrical connection between the metallic or conductive material and the source and drain regions may be formed directly on the nano-rod structure.

Example parameters for the annealing process used to round the corners of the channel region 44 will be described next. The temperature for the annealing process may range from about 600° C. to about 1200° C. The anneal time may range from about 1 second to about 2 hours. The pressure in the reaction chamber (not shown) used for the annealing process may vary, depending in part upon the environment within the reaction chamber. The reaction chamber may be a chemical vapor deposition (CVD) epitaxial reactor, for example. The annealing process may occur in a reaction chamber having an environment of hydrogen gas ($H_2$) at a partial pressure ranging from about $1.0 \times 10^{-9}$ torr to about 800 torr. In another embodiment, the annealing environment may be evacuated (i.e., a vacuum environment) at a pressure ranging from about $1.0 \times 10^{-10}$ torr to about $1.0 \times 10^{-3}$ torr. In still another embodiment, the annealing environment may be nitrogen gas ($N_2$) at a pressure ranging from about $1.0 \times 10^{-9}$ torr to about 800 torr. The annealing environment may also be one of the following environments (but not limited to): an environment of a mixed gas including hydrogen and argon; an environment of a mixed gas including hydrogen and nitrogen; an environment with other gases in addition to hydrogen to form a mixed gas ambient; or an environment of an inert gas, for example.

In a preferred embodiment, the annealing process is performed in a hydrogen gas ($H_2$) ambient at about 900° C. for about 2 minutes. During testing, annealing a 28 nm thick silicon channel region 44 under such conditions did not reveal crystal defects.

Figure 4B:
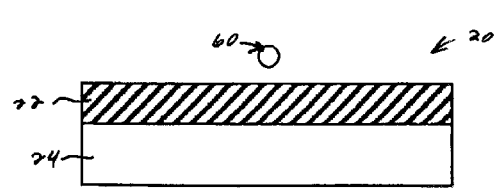
Figure 4A:
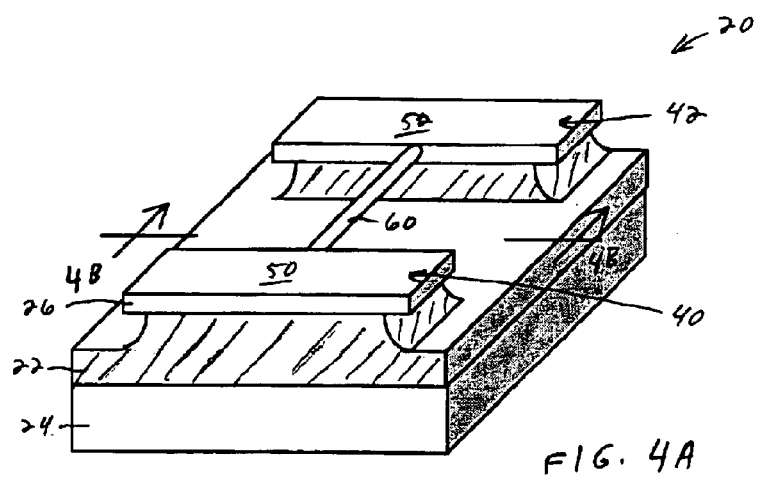

After forming the nano-rod structure 60, the insulating layer 22 may be etched to expose the bottom surface of the nano-rod 60, as shown in FIGS. 4A and 4B. The nano-rod 60 is supported by the contact portions 50 and 52 of the source and drain regions 40 and 42. It is preferred to etch away the insulating layer 22 beneath the nano-rod 60 at least enough to allow the gate to wrap around the nano-rod 60 for optimum gate control performance. The use of the annealing process of the present invention to form a nano-rod structure 60 (described above) may also be applied to a non-wrap-around gate design (i.e., where the gate electrode only covers three sides of the gate channel, or where the gate electrode does not completely wrap around the gate channel).

Figure 5B:
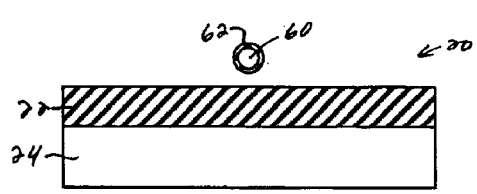
Figure 5A:
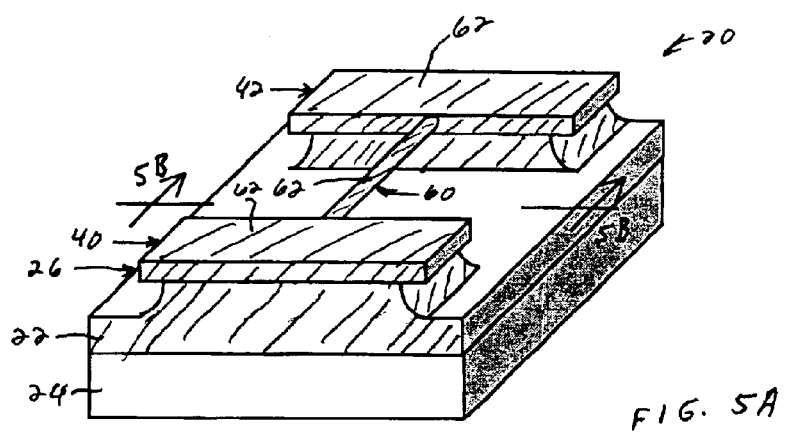

Next, a gate dielectric material 62 is formed on the surface of and about the nano-rod structure 60 (as well as on the other exposed portions of the silicon layer 26), as shown in FIGS. 5A and 5B. As shown in FIG. 5B, because the nano-rod 60 is exposed on all sides after etching away part of the insulting layer 22, the gate dielectric material 62 may be formed completely around the nano-rod surface. The gate dielectric material 62 may be an oxide formed by thermal oxidation or atomic-layer CVD for uniform deposition, for example. Hence, the gate dielectric will likely form on all exposed areas, including the contact portions 50, 52 of the source and drain regions 40, 42. The gate dielectric material may take the form of a variety of compositions, including but not limited to: silicon dioxide ($SiO_2$), silicon oxynitride ($SiO_xN_y$), $HfO_2$, $ZrO_2$, $Al_2O_3$, $La_2O_3$, or other high permittivity materials, for example.

Figure 6B:
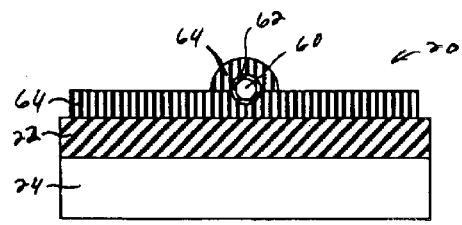
Figure 6A:
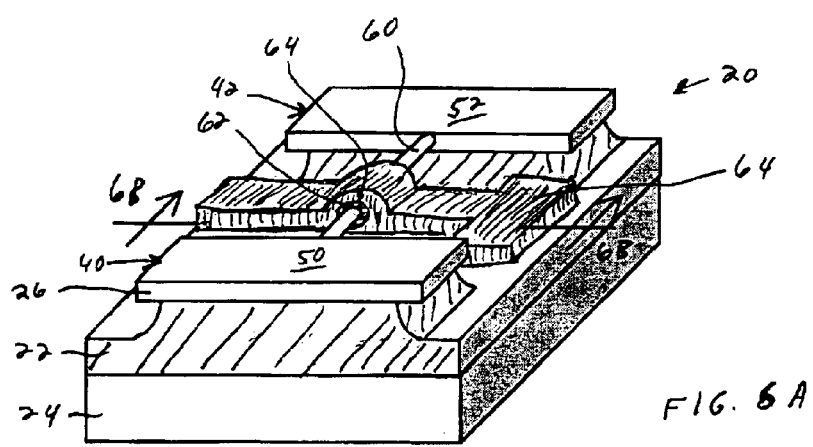

A gate electrode material is then deposited, masked, and etched to form the gate electrode 64, as shown in FIGS. 6A and 6B. The gate electrode material may be selected from a variety of materials, including but not limited to: a semiconductor material (e.g., poly-silicon, poly-silicon-germanium); a metal material (e.g., molybdenum, tungsten, titanium); a metallic nitride (e.g., tantalum nitride, titanium nitride); or any combination thereof, for example. As shown in FIG. 6B, because the nano-rod 60 is elevated above the insulating layer 22 (at least where the channel will be formed), the gate electrode 64 may be formed completely around the nano-rod 60, as preferred. During or after the etching of the gate electrode material to form the patterned gate electrode 64, the gate dielectric material 62 may be removed from the source and drain regions, as shown in FIG. 6A.

Because the gate dielectric 62 is preferably aligned with the gate electrode 64 at the channel, the gate dielectric 62 can be self-aligned with the gate electrode 64 by simply etching the gate electrode material with an etch chemistry that will also etch away the gate dielectric material 62 while being selective against etching the silicon layer 26. Also, because the gate dielectric 62 at the gate channel is shielded by the gate electrode 64, the ion implantation processes for doping the silicon layer 26 outside of the channel (i.e., to form the source and drain of the transistor 20) may be self-aligning as well.

Figures 7A, 7B, 7D:
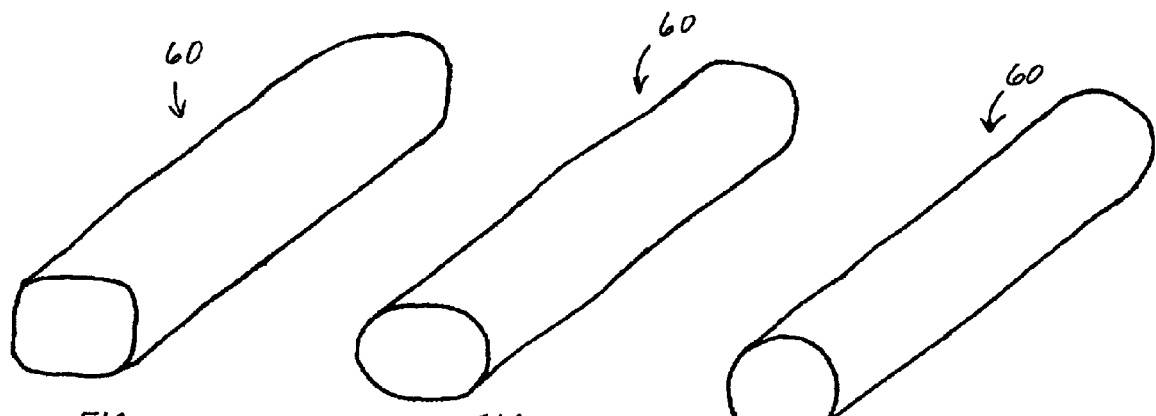
Figure 7C:
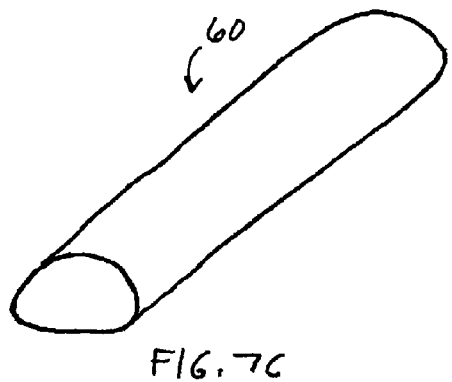

As shown in FIGS. 7A, 7B, 7C, and 7D, the resulting shape of the nano-rod 60 formed at the channel region 44 may vary, depending on the annealing parameters used. For example, the nano-rod portion 60 shown in FIG. 7A has a generally rectangular shaped cross-section with rounded corners (i.e., more than 4 crystal faces). The nano-rod portion 60 shown in FIG. 7B has a generally oval-shaped cross-section. In other embodiments, the nano-rod cross-section may have a rounded but arbitrarily shaped or somewhat arbitrarily shaped, as shown in FIG. 7C for example. However, as described above, the preferred shape of the nano-rod cross-section for a preferred transistor embodiment is circular, as shown in FIG. 7D. Preferably, the nano-rod 60 has a diameter no larger than about 65 nm. The diameter of the nano-rod cross-section may be in the order of nanometers (e.g., about 4 nm), and such nano-rods may be used for the channel of a field-effect transistor, for example.

In another manufacturing embodiment (not shown) of present invention, after FIG. 2A, part of the insulating layer 22 may be etched away before the annealing process for rounding the corners of the channel region 44. Also, after FIG. 5A, the gate dielectric material 62 may be patterned and etched (to leave a gate dielectric portion around the nano-rod 60 where the gate channel will be formed) before the deposition of the gate electrode material. In still another embodiment, after FIG. 5A, the gate electrode material may be etched using a first etch chemistry to form the gate electrode 64, and then the gate dielectric material 62 may be etched using a second etch chemistry after forming the gate electrode 64. In such case, the gate electrode 64 may act as a self-aligning mask for the etching of the gate dielectric material 62 to shield the gate dielectric between the gate electrode 64 and the nano-rod 60.

Although several embodiments of the present invention have been described in detail, it should be understood that various changes, substitutions and alterations can be made herein without departing from the spirit and scope of the invention as defined by the appended claims. Moreover, the scope of the present application is not intended to be limited to the particular embodiments of the processes, machines, manufactures, compositions of matter, means, methods and steps described in the specification. As one of ordinary skill in the art will readily appreciate from the disclosure of the present invention, processes, machines, manufactures, compositions of matter, means, methods, or steps, presently existing or later to be developed, that perform substantially the same function and/or achieve substantially the same result as the corresponding embodiments described herein may be utilized according to the present invention. Accordingly, the appended claims are intended to include within their scope such processes, machines, manufactures, compositions of matter, means, methods, or steps.

What is claimed is:

1. A method of manufacturing a semiconductor device, comprising:

providing a semiconductor structure comprising a semiconductor layer overlying an insulating material;

patterning the semiconductor layer to form a source region, a channel region, and a drain region in the semiconductor layer, wherein the channel region extends between the source region and the drain region; and rounding corners of the channel region by annealing.

2. The method of claim 1, wherein the annealing occurs in a reaction chamber having an environment therein including a gas selected from a group consisting of hydrogen, nitrogen, a mixed gas including hydrogen and argon, a mixed gas including hydrogen and nitrogen, and an inert gas.

3. The method of claim 2, wherein the annealing environment is $H_2$ gas at a pressure ranging from about $1.0 \times 10^{-9}$ torr to about 800 torr.

4. The method of claim 2, wherein the annealing environment is $N_2$ gas at a pressure ranging from about $1.0 \times 10^{-9}$ torr to about 800 torr.

5. The method of claim 1, wherein the annealing occurs in a reaction chamber having an evacuated environment.

6. The method of claim 5, wherein the annealing environment is a vacuum environment at a pressure ranging from about $1.0 \times 10^{-10}$ torr to about $1.0 \times 10^{-3}$ torr.

7. The method of claim 1, wherein the annealing occurs in a reaction chamber having a temperature ranging from about 600° C. to about 1200° C. therein.

8. The method of claim 1, wherein the annealing occurs at an anneal time ranging from about 1 second to about 2 hours.

9. The method of claim 1, wherein the annealing is performed in a hydrogen gas ($H_2$) environment at about 900° C. for about 2 minutes.

10. The method of claim 1, further comprising:

etching the insulating layer using an etch chemistry selective against etching the semiconductor layer, wherein the etching is performed long enough so that at least a segment of the channel region is suspended above a proximate portion of the insulating layer;

forming a gate dielectric material on a surface of and about the rounded channel region;

forming a gate electrode material on the gate dielectric and about the rounded channel region; and patterning the gate electrode material to form a gate electrode, the gate electrode comprising a gate wrap region that wraps around the rounded channel region and a gate contact region extending therefrom.

11. The method of claim 1, further comprising:

doping exposed portions of the semiconductor layer.

12. A method of manufacturing a semiconductor nano-rod device, comprising:

patterning a semiconductor layer to form a source region, a channel region, and a drain region in the semiconductor layer, wherein the channel region extends between the source region and the drain region;

rounding corners of the channel region by annealing the channel region;

etching the insulating layer using an etch chemistry selective against etching the semiconductor layer, wherein the etching is performed long enough so that at least a segment of the rounded channel region is suspended above a proximate portion of the insulating layer;

forming a gate dielectric material on a surface of and about the rounded channel region;

forming a gate electrode material on the gate dielectric and about the rounded channel region; and patterning the gate electrode material to form a gate electrode, the gate electrode comprising a gate wrap region that wraps around the rounded channel region and a gate contact region extending therefrom.

* * * * *